THERMIONIC VALVE OSCILLATOR AND AMPLIFIER

Filed Aug. 7, 1947

INVENTOR
E. R. WIGAN
BY Mascock Downing & Seebold
ATTYS.

INVENTOR
E. R. WIGAN
BY Glascock Downing & Seebold
ATTYS.

April 17, 1951 E. R. WIGAN 2,549,553

THERMIONIC VALVE OSCILLATOR AND AMPLIFIER

Filed Aug. 7, 1947 3 Sheets-Sheet 3

INVENTOR
E. R. WIGAN
BY Glascock Downing & Seebold
ATTYS.

Patented Apr. 17, 1951 2,549,553

UNITED STATES PATENT OFFICE 2,549,553

THERMIONIC VALVE OSCILLATOR AND AMPLIFIER

Edmund Ramsay Wigan, Barnham, England

Application August 7, 1947, Serial No. 767,065
In Great Britain January 27, 1939

Section 1, Public Law 690, August 8, 1946
Patent expires January 27, 1959

6 Claims. (Cl. 250—36)

This invention relates to thermionic valve oscillators and amplifiers.

Certain types of oscillators (which, with reduced "reaction" can be used also as selective amplifiers) depend upon phase-shifting networks for the selection of the frequency generated (or the frequency of maximum amplification). See for instance British Specifications Nos. 489,849 and 395,596.

The object of the invention is to improve the construction and simplify the use, calibration and adjustment of such oscillators by providing (1) means for selecting in a simple and accurate manner the frequency desired, (2) means for compensating for manufacturing tolerances, and for errors due to residual capacitances and leakage resistances in valves and circuit components, and (3) means for compensating for the effects of temperature changes.

Oscillators and amplifiers constructed in accordance with this invention are well adapted for ease of manufacture. Moreover, the special tuning system proposed provides for a very large number of accurately known frequency settings without the use of any subsidiary aids such as separate calibration charts, or elaborately subdivided calibration scales.

*Known methods of frequency selection*

In the patents quoted it has been proposed to select the frequency of oscillation (or maximum amplification) by adjusting the phase-shift produced by a series of stages of resistive and reactive networks.

The second of the patents quoted employs three stages of phase-shift, the first employs two stages. But in each case the same basic principle is used, i. e. that a series of amplifying stages and phase-shifting stages are joined up in a continuous circuit, and that the gain in the amplifier stages is made slightly greater than the loss in the phase-shifting stages; then for one particular frequency (one frequency in the case of British Patent No. 489,849, but more than one in the case of British Patent No. 395,596) the shift of phase in the networks will be just sufficient to bring the system into oscillation (or, with reduced gain in the amplifying stages, to maximum amplification). The case of apparatus as described in British Patent No. 439,849, will be considered in detail here since it involves fewer variables, but it will be clear that the technique proposed in this invention can be extended, if desired, to apply to the case of more complex apparatus as described, for instance, in British Patent No. 395,596.

In British Patent No. 489,849 a two-valve system is described. It is known that an amplifier with two valves only will provide an output voltage which is substantially in phase with the input voltage over a wide range of frequency if R/C coupling is used and certain well-known precautions are taken. More particularly is this the case if advantage is taken of the well-known principles of negative feed-back. In the Patent quoted it is shown that if the output of such an amplifier is coupled back to the input through a network which provides zero phase-shift at one frequency only, and if the power loss in the network at that frequency is less than the gain of the amplifier the system will oscillate at that frequency, or alternatively that a certain reduction of the gain of the amplifier will lead to a system which is not oscillating but is highly selective at the frequency of incipient oscillation.

It has been proposed to control the frequency of such a system by varying either the resistance or the reactance components of the phase-shifting networks.

*Proposed method of frequency selection*

According to this invention it is now proposed to select the frequency by varying two of the components of the phase-shifting networks according to a particularly advantageous principle, to be described. Secondly, to provide one adjustment of a component not so varied so as to take account of the residual and variable phase-shifts which exist in the amplifier and elsewhere and cannot readily be compensated or otherwise allowed for, and thirdly to provide a second adjustment of this or another component to take account of temperature changes.

It is also proposed to adopt phase-shifting networks which are proportioned so that the principle referred to above is applicable, without compensation being applied, over the widest frequency range feasible.

The principle referred to above according to which it is proposed to vary the components of the phase-shifting networks can be explained most readily by reference to a particular network which is combined with a two-valve R/C coupled amplifier. It will be appreciated, however, that it is not intended to limit the scope of the invention to the use of this network or to this combinaion of valves.

Consider a circuit consisting of two parts A and B, part A consisting of a resistance $R_1$ in series with a condenser $C_1$, and part B consisting of a resistance $R_2$ in parallel with a condenser $C_2$. Then, as is well known, if A and B are connected in series across a source of alternating voltage, the relationship between the voltage across part B and the voltage across the two parts in series will be such that at a certain input frequency $F_0$ these two voltages will be in phase with one another. Such a network is therefore suitable for use in oscillators of the type described above, to connect the output of the amplifier stage to the input of the stage.

The frequency $F_0$ is given by the relationship $$W_0=2\pi F_0=\frac{1}{\sqrt{R_1R_2C_1C_2}}\text{ C. P. S.}$$

where $R_1$ and $R_2$ are expressed in ohms and $C_1$ and $C_2$ in farads.

When, however, such a network is connected to form the phase-shifting section of an oscillator of the type described the frequency of the oscillation developed is different from that given by the above equation by an amount which is dependent on the output impedance of the amplifier stage. This impedance has to be considered as a part of the quantity $R_1$ if the formula is to be exact.

It is one of the objects of this invention to provide networks in which the phase-shift is determined to a high degree of accuracy by the quantity $$\frac{1}{\sqrt{R_1R_2C_1C_2}}$$

One such network is made by adding a third resistance $R_3$ to the network in series with the part B, this resistance being made approximately equal to one-half of the effective output impedance of the amplifier, measured at the point at which the network is connected.

In cases in which the amplifier is imperfect it is found that the choice of a resistance rather in excess of the value just specified increases the range of frequency over which the equation is applicable. The failure of the equation at low frequencies is due to phase-shift in the amplifier (due to the finite capacitance of the coupling condensers), and at high frequency to residual capacitances in valves and other components. (It is pointed out here that the effect of the former phase-shift is to add a small fixed quantity to the calculated frequency except when the latter is of the order of 20 C. P. S. or less). The resistance $R_3$ operates to correct the high-frequency end of the range.

*Proposed "reciprocal" tuning principle.*—Let us consider now the advantages of an oscillator to which the equation above has been found to apply, e. g. one in which the resistance $R_3$ is incorporated in the network.

Let $C_1$ and $C_2$ be fixed and let $R_1$ and $R_2$ be adjustable simultaneously. Then if the latter are varied in equal proportion the attenuation of the network (in conjunction with the amplifier) at the frequency of oscillation, remains constant, while the frequency varies in proportion to $$\frac{1}{\sqrt{R_1R_2}}$$

which is equal to $$\frac{K}{R_1}$$

where K is a constant depending on the ratio of $R_1$ to $R_2$.

If the law $$F_0=\frac{K}{R_1}$$

is followed, we should have keeping $C_1$ and $C_2$ constant and making $R_2$ always proportional to $R_1$ $$F_1=\frac{K}{r_1}$$

(writing $r_1$, for one value of $R_1$ and adjusting the resistance at $R_2$ in proportion) and $$F_2=\frac{K}{r_2}$$

(writing $r_2$ for another value of $R_1$ and adjusting the resistance at $R_2$ in proportion) so that $$F_1+F_2=K\left(\frac{1}{r_1}+\frac{1}{r_2}\right)=\frac{\frac{K}{1}}{\frac{1}{r_1}+\frac{1}{r_2}}=\frac{K}{r_{1\cdot 2}}$$

where $r_{1.2}$ is the resistance of $r_1$ and $r_2$ in parallel.

The significance of this equation is that if the resistance $r_1$ is switched into circuit at $R_1$ and a proportional resistance into circuit at $R_2$ to obtain a frequency ($F_1$) and then a resistance $r_2$ (which, by itself would produce a frequency$=F_2$) is connected in parallel with $r_1$, while a proportional resistance is parallel at $R_2$ the result will be the generation of a frequency equal to $$(F_1+F_2)$$

This procedure can be continued indefinitely so that any number of pairs of resistances when joined in parallel in the circuit will result in the generation of a frequency equal to the sum of the frequencies produced by the individual pairs of resistances when brought into circuit separately, provided that the influence of the amplifier output impedance has been cancelled by the use of resistance $R_3$.

For example if $$W_0=\frac{1}{\sqrt{C_1C_2R_1R_2}}$$

as before, and $C_1=C_2=0.01596$ $\mu$f. and $R_1$ and $R_2$ are equal but varied in an identical manner, then over the range of frequency within which the internal phase-shift in the amplifier is negligible, and if $R_3$ is correct:

$$W_0=2\pi F_0=\frac{1}{C_1R_1}$$

or $$F_0=\frac{10^7}{R_1}$$

With these arrangements a resistance of 1000 ohms at $R_1$ and $R_2$ will provide a frequency of 10,000 C. P. S., a resistance of 10,000 ohms at $R_1$ and $R_2$ will provide a frequency of 1000 C. P. S. and a frequency of 11,000 C. P. S. will be provided by bringing both these resistances into circuit at once in parallel with each other.

An argument on the same lines, based on keeping $R_1$ and $R_2$ fixed and varying $C_1$ and $C_2$ simultaneously, leads to the conclusion that if the capacities $C_1$ and $C_2$ are varied by adding additional capacities in series (as distinct from the addition of resistances in parallel as in the previous case) the law connecting frequency and capacity has the same general form as that just described for the case of resistances added in parallel. In this case the resistance $R_3$ is not essential.

*Advantages derived from reciprocal tuning principle*

Clearly the selection of frequency becomes very simple if the law of frequency addition just discussed is made use of. One of the many forms in which this invention can be carried out will be described.

For example an oscillator or selective amplifier designed in accordance with this invention to cover the range of frequency 50 to 16,000 C. P. S. in steps of 10 C. P. S. would be composed as follows:

The total capacitance of all condensers making up the capacitance $C_1$ would be of the order of 0.016 $\mu$f. with about 10% of the capacitance contained in two variable condensers *a* and *b*, whose functions are explained below.

The condensers $C_1$ and $C_2$ would be of the same order of capacity.

The sets of paralleled resistances at $R_1$ and $R_2$ would be identical. The resistances contained in each set would be as follows:

| Resistance | Frequency selected by resistance when in circuit alone | |
|---|---|---|
| *Ohms* | | |
| 1,000 | 10,000 C. P. S. | These 13 frequencies may be combined to provide over 1,500 frequencies differing by 10 C. P. S. between 50 and 16,000 C. P. S. |
| 10,000 | 1,000 C. P. S. | |
| 5,000 | 2,000 C. P. S. | |
| 5,000 | 2,000 C. P. S. | |
| 2,000 | 5,000 C. P. S. | |
| 100,000 | 100 C. P. S. | |
| 50,000 | 200 C. P. S. | |
| 50,000 | 200 C. P. S. | |
| 20,000 | 500 C. P. S. | |
| 1,000,000 | 10 C. P. S. | |
| 500,000 | 20 C. P. S. | |
| 500,000 | 20 C. P. S. | |
| 200,000 | 50 C. P. S. | |

Suitable switches are arranged to parallel any desired combination of resistances.

For frequencies at which the amplifier phase-shift is serious (i. e. above about 20 kc.) the variable condenser *a* is set to predetermined values for each frequency.

The condenser *b* is set to a predetermined value dependent on the temperature of the apparatus. Alternatively this condenser may be of the type which can be adjusted to have either positive or negative temperature coefficient, and thus take account of the capacity and resistance changes.

In the case of an oscillator in which the frequency is varied by varying the capacitance instead of the resistance, the temperature correction is affected by a variable resistance.

The amplifier stage of this arrangement would consist, for example, of 2 H. F. pentode valves R/C coupled. Indirectly heated valves would be used with automatic grid bias obtained from resistances in the cathode-earth lead. No condensers would be used across these resistances. Negative feed-back would be used to apply a fraction of the output voltage of the stage in opposition to the input voltage of the stage. The phase-shifting network would be connected across a part of the potential dividing circuit which provides the negative feed-back voltage.

The output impedance of the amplifying stage measured at this point would be of the order of 1000–2000 ohms and the resistance $R_3$ would be of the order of 500–1000 ohms. An alternative design of oscillator contains a number of units of capacitance arranged to be added in series to control the frequency.

*Compensation of residual phase-shifts in amplifier*

(1) In the case of oscillators in which the resistive components are variable, if the resistance $R_3$ is made equal to one-half the output impedance of the amplifier the reciprocal law connecting frequency and resistance holds closely, in the case of carefully chosen components and a well designed amplifier, over a frequency range such as 100 to 15,000 C. P. S. At higher frequencies the frequency generated is lower than the law indicates.

If the value of $R_3$ is raised the lower frequencies are very slightly raised but the higher frequencies are strongly affected. The law then does not hold rigidly except at one frequency near the higher end of the useful frequency range. By proper choice of $R_3$, depending on the residual phase-shifts due to the amplifier and other components, the law connecting frequency and resistance can be made to follow the ideal law up to a high frequency with negligible error.

Clearly, the correcting effect of $R_3$ is limited. By increasing $R_3$, very high frequencies can be obtained but only at the expense of complete failure of the reciprocal law.

(2) If the condenser $C_1$ is provided with a trimming condenser *a* in parallel with it, the useful frequency range of the circuit can be raised still further.

For example, a trimming capacity *a* equal to about 10% of $C_1$ can be used to approximately double the range of frequency over which the reciprocal law will hold.

The use of the condenser *a* is as follows, over the lower part of the frequency range *a* is set at maximum and is undisturbed.

At some frequency such as, for example, 20 kc., the departure from the reciprocal law becomes serious. Beyond this point condenser *a* is reduced to a predetermined value for each frequency chosen. Thus over this higher range the selected frequency is obtained only after setting the condenser *a* to the correct value as well as setting the variable resistance units to the correct value.

Since the scale of the condenser *a* is graduated only as the final stage of adjustment of the whole assembly, this graduation takes account of all the residual phase-shifts and uncorrected errors in the amplifier and in the wiring, and so simplifies and cheapens the construction of the amplifier.

It should be noticed, however, that the interpolation of frequencies by means of the variable resistances $R_1$ and $R_2$ will be accurate only in so far as the values of the resistances $R_1$ and $R_2$ are accurate.

Another source of frequency error is that due to the phase-shift in the amplifier which is caused by changes of oscillation amplitude. It is proposed that if high accuracy of frequency is desired, means will be provided so that the amplitude of oscillation is held at a predetermined value. Such means may consist, for example, of a device which applies a negative bias to the "suppressor" grid of either or both the two valves which form the amplifier section of the oscillator if the amplitude increases.

*Output circuits*

It will be understood that in order to deliver any large amount of power from oscillators of the type described, it is necessary to provide an output stage of amplification. A convenient method of doing this is to make the second of the two valves a pentode in which the two inner electrodes are acting with the first valve to form the amplifier section of the oscillator, and in which the output anode circuit is screened from the input by the electron-coupling.

The invention will be described further in detail and by way of example with reference to the accompanying drawings, in which.

In the figures illustrating the networks, the capacities and resistances are shown in the conventional manner and are referred to respectively as $C_1$, $C_2$, $R_1$, $R_2$.

*Networks suitable for use in decade oscillator*

Figure 2:
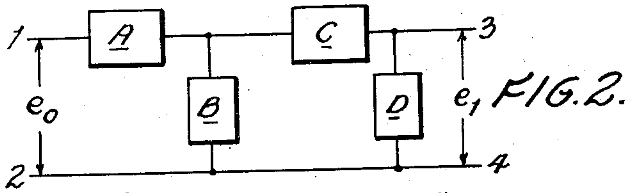
Figure 2 illustrates diagrammatically the general form of the networks, A, B, C and D denoting the impedances of the network, $e_0$ denoting the voltage applied to network across terminals 1, 2 and $e_1$ denoting the voltage across terminals 3—4.

The general form of such networks is shown, as above stated, in Figure 2, where A, B, C and D denote the impedances of the network elements.

The network elements may consist of resistances or condensers or a combination of both, such that the network as a whole gives a phase displacement between terminals 1—2 and 3—4 which is zero or nearly zero at the desired oscillation frequency and which varies in opposite sense for frequencies on either side of this value.

Figures 3, 7:
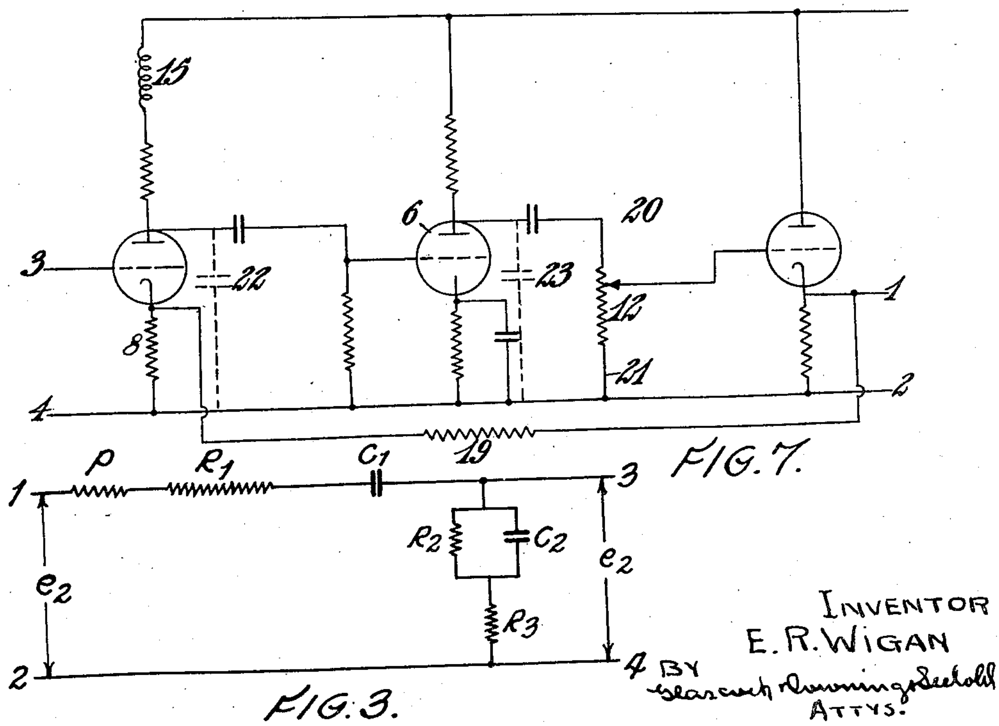
Figure 3 illustrates a network comprising an arrangement of elements, as above defined.

The expression connecting $e_0$ and $e_1$ is $$\frac{e_0}{e_1}=1+\frac{A}{D}+\frac{A}{B}+\frac{C}{D}+\frac{AC}{BD}$$

and this expression can be used to determine the transmission characteristics of networks of this type. A suitable network for use in decade oscillators is shown in Figure 3.

In the network shown, provided the ratios $$\frac{R_1}{R_2}$$

and $$\frac{C_1}{C_2}$$

are kept constant, the loss through the network at the frequency for zero phase-shift is always the same irrespective of the actual values of $R_1$, $R_2$, $C_1$ and $C_2$.

Figure 4:
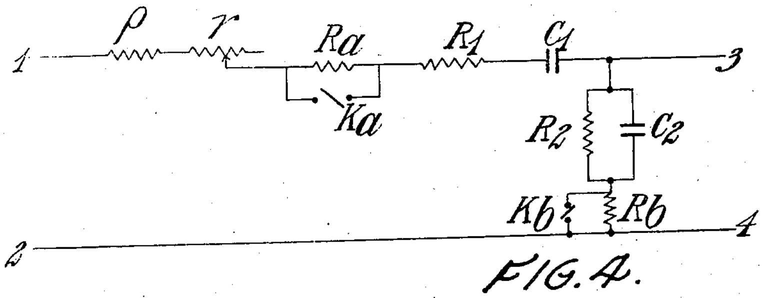
Figures 4 and 5 illustrate networks including certain additional elements the purpose of which will be described below.
Figure 5:
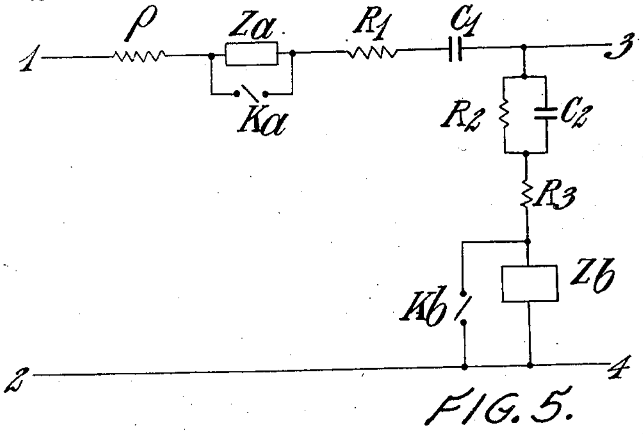

If such a network is inserted between the output and input of an amplifier giving zero phase-shift between input and output, and having an output impedance $R_0$ and an input impedance which is high compared with that of the network, then provided that the gain of the amplifier is equal to or only slightly exceeds the attenuation through the network, the oscillation frequency is given by the expression $$W^2=\frac{1}{R_1C_1C_2\left[R_2+R_0\left(1+\frac{R_2}{R_1}\right)\right]}$$

for the network of Figure 3, and by $$W^2=\frac{1}{(R_1+R_0)R_1C_1C_2}$$

for the networks of Figures 4 and 5.

It will be seen that W is proportional to $$\frac{1}{\sqrt{C_1C_2}}$$

and therefore if $mC_2=C_1$ $$W \text{ is proportional to } \frac{1}{C_1}$$

This being so, if $R_1$, $R_2$, $R_0$ and $m$ are kept fixed and if $$\frac{1}{C_1}$$

and $$\frac{1}{C_2}$$

are both varied simultaneously by switching appropriate condensers in series with $C_1$ and $C_2$ then the law of frequency addition previously referred to will hold.

Figure 11:
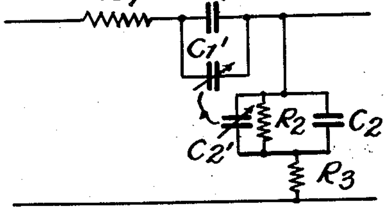
Figure 11 shows a network with trimmer condensers.
Figure 1:
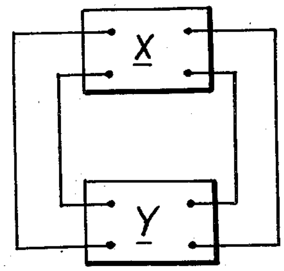
Figure 1 shows the general form of a thermionic valve oscillator in accordance with the invention, X being an amplifier with zero phase-shift, and Y the network.

Suitable values for use are shown in Figure 11.

The same effect cannot be obtained exactly by varying resistances $R_1$ and $R_2$ unless $R_0$ is equal to zero, or unless $R_0$ is varied in proportion to $R_1$. This is cumbersome since it involves three variables.

Figure 6:
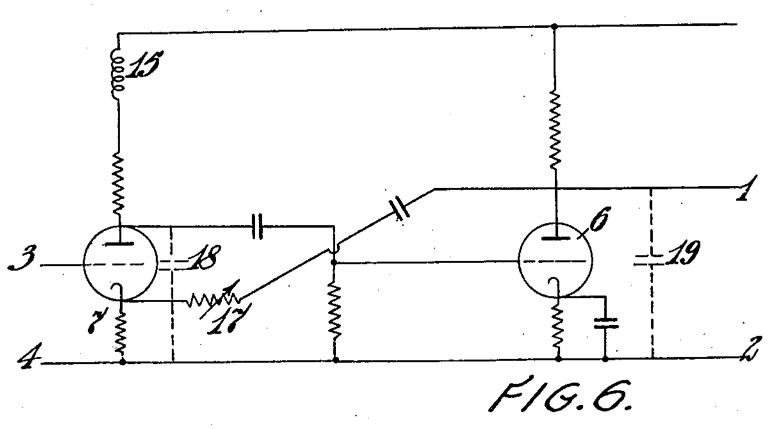
Figures 6 and 7 illustrate two forms of amplifier which may be employed in accordance with the invention.

Referring to Figure 6, when this network is used with an amplifier of zero phase-shift and having an output impedance $R_0$ so as to generate sinusoidal oscillations, the frequency of oscillation is given by $$W^2=\frac{1}{R_1R_2C_1C_2}$$

provided that $$R_3=R_0.\left(\frac{R_2C_1}{R_1C_1+R_2C_2}\right)$$

which reduces to $$\frac{R_0}{2}$$

if $R_1=R_2$ and $C_1=C_2$. Thus the addition of $R_3$ to the network of Figure 5 enables this network to be used with a suitable amplifier to give a frequency determined by $$W^2=\frac{1}{R_1R_2C_1C_2}$$

which is independent of $R_0$ and if $nR_2=R_1$ and $mC_2=C_1$ $$W=\frac{\sqrt{mn}}{R_1C_1}$$

In this case either $$\frac{1}{R_1} \text{ or } \frac{1}{C_1}$$

but not both at the same time can be varied in the one case by switching resistances in parallel with $R_1$ and $R_2$ and in the other case by switching condensers in series with $C_1$ and $C_2$ and in both cases the aforementioned law of frequency addition will hold.

The ratios $m$ and $n$ must be kept fixed.

*Optimum proportions of network.*—The optimum network is one in which a given phase change in the amplifier produces a minimum change in oscillation frequency.

If $nR_2=R_1$ and $mC_2=C_1$ $W_0$=nominal frequency (i. e. that given when amplifier phase-shift is zero)

W=actual frequency $\theta$ represents amplifier phase angle.

then $$\left(\frac{W}{W_0}-\frac{W_0}{W}\right)=\tan\theta\left(\sqrt{\frac{n}{m}}+\sqrt{mn}+\frac{1}{\sqrt{mn}}\right)$$

which is a minimum if (1) $mn=1$ (2) $n$ is small compared to $m$

With regard to condition (2) however, as $n$ is decreased, the amplifier gain has to be increased so that it is not advisable to make $n$ smaller than ½.

A preferred network has the proportions $$m=1 \qquad n=1$$

*Tapping down on output of network.*—If desired, the loss through the networks of Figure 3 can be increased without altering the frequency for zero phase-shift. This can be done by tapping down the component across the terminals 3—4, that is, the condenser $C_2$.

*Alternative reaction control.*—Instead of controlling reaction by means of the amplifier this may be effected by the use of a high resistance potentiometer across the terminals 3—4 of any of the networks. The advantage of the arrangement is that the output impedance of the amplifier is not appreciably affected by this reaction control.

*Effect of potentiometer on various networks*

*$C_1$ and $C_2$ varied.—Figure 3.*—As long as the potentiometer resistance is very high compared with $R_2$, its presence will have a very small effect on the frequency for zero phase-shift.

*$R_1$ and $R_2$ varied.—Figure 3.*—The potentiometer control is impracticable in this network.

*Figures 4 and 5.*—Effect is to add a constant number of cycles (small if potentiometer resistance is large c. f. $R_2$) to all the frequencies generated.

*Figure 6.*—Same as 4 and 5 provided that $R_3$ is small compared with $R_2$.

*Compensation for changes of amplifier output impedance due to changes of valves or other causes*

Referring to Figure 3, when $R_0$ the output impedance of the amplifier changes, frequency for zero phase-shift is not given by $$W^2=\frac{1}{R_1R_2C_1C_2}$$

unless $R_3$ is varied a proportional amount.

$R_3$ is in consequence made variable in order to compensate for such changes.

Referring to Figure 4, a variable resistance $r$ is introduced to compensate for changes in amplifier output impedance $R_0$. If $R_0$ changes in value $r$ can be varied so as to bring the sum of $R_0$ and $r$ back to its original value. A method of checking whether the sum of $R_0$ and $r$ has in fact been brought back to its original value is provided by the resistances $R_a$ and $R_b$. When these are switched in and out of circuit together the frequency will not change if the adjustment of $r$ has been properly carried out.

The ratio $$\frac{R_a}{R_b+R_0+r}=\frac{R_2C_1}{R_1C_1+R_2C_2}$$

defines the values of $R_a$ and $R_b$ for use in networks of the type Figure 5.

Referring to Figure 5, the impedances $Z_a$ and $Z_b$ provide a means for checking whether the adjustment of $R_3$ is correct. If this adjustment is correct then throwing the impedances $Z_a$ and $Z_b$ in and out of the circuit will not alter the frequency generated.

The ratio $$\frac{Z_a}{Z_b}=\frac{R_2C_1}{R_1C_1+R_2C_2}$$

defines the values of $Z_a$ and $Z_b$ for use in networks of the type Figure 3.

Suitable amplifiers are shown in Figures 6 and 7. Both are negative feed-back amplifiers in which the feed-back connection is applied between the output of the amplifier and cathode of the first valve.

The gain may be made very nearly equal to the feed-back ratios in each case.

*Figure 6.*—Gain $=\dfrac{\text{resistance 7 + resistance 17}}{\text{resistance 7}}$

*Figure 7.*—Gain $=\dfrac{\text{resistance 8 + resistance 19}}{\text{resistance 8}}$ Phase-shift will be very small over a wide range of frequencies.

A beneficial effect of this form of negative feedback is to lower the output impedance between terminals 1—2.

The amplifier of Figure 7 is better than that of Figure 6 in this respect and can be designed to have an output impedance of about 40 ohms.

Control of regeneration is effected in the case of Figure 6 by resistance 17 and in the case of Figure 7 by the potentiometer 12.

The valve 6 in Figures 6 and 7 may be a pentode arranged to work on a point of inflexion of its characteristic thus reducing second harmonic to negligible proportions.

*Automatic volume control.*—Advantage with regard to reduction of harmonic and constancy of output voltage may be obtained by working all valves on linear portions of their characteristic and controlling amplitude by means of a separate component.

Such component may be:

(1) An element exhibiting increase of resistance when the voltage across it is increased, such as an incandescent lamp. This may be used for the resistance 7 in Figure 6, and 8 in Figure 7. Then as the amplitude increases the gain of amplifier decreases, and vice versa.

(2) An element exhibiting falling resistance as the voltage is increased. This may be used for resistance 17 in Figure 6, and 19 in Figure 7. Then as the amplitude increases the gain of the amplifier decreases and vice versa.

(3) Either types of element may be used in Figure 7. An element with a rising characteristic being placed in the lead 20 or an element with a falling characteristic being placed in lead 21.

(4) A form of A. V. C. as described in the preceding portion.

*Reduction of amplifier phase-shift at high frequencies*

With resistance coupled amplifiers the chief cause of phase-shift at high frequencies is the presence of stray inherent capacitances 18 and 19 (Figure 6), 22 and 23 (Figure 7). With the addition of negative feed-back as shown the phase-shift from this cause is reduced, also the phase-shift due to 19 and 23 is reduced much more than that due to 18 and 22. It follows that a further considerable reduction of phase-shift can be obtained if that due to 18 and 22 is reduced.

This is the purpose of the inductance 15 (Figures 6 and 7).

Figure 8:
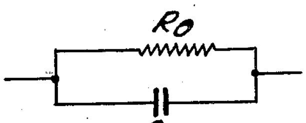
Figures 8 and 9 illustrate two further network elements.
Figure 9:
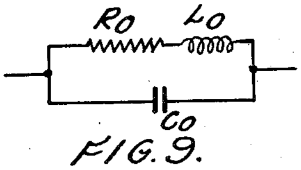

The effect can best be shown by reference to Figures 8 and 9.

*Temperature compensation.*—A similar separate trimming component may be used to take up variations in frequency due to changes in ambient temperature.

A change in this component will have the effect of changing all the frequencies generated by the same percentage.

Figure 10:
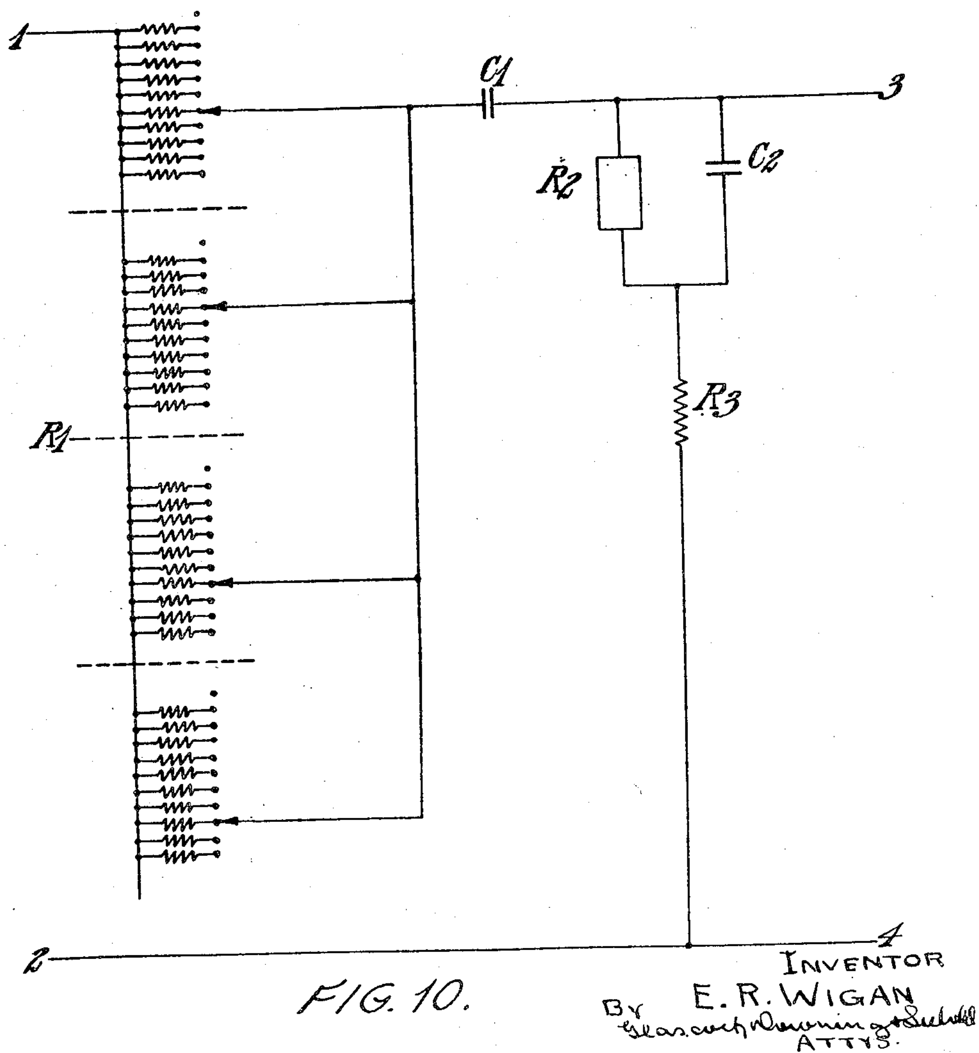
Figure 10 illustrates a network as shown in Figure 3, arranged to permit variation in frequency according to a decade law.

Referring to Figure 10 which shows a network as illustrated in Figure 3 furnished with a plurality of fixed resistance elements arranged to vary frequency according to a decade law.

The resistance $R_1$ as will be seen is made up of sets of fixed resistances, and the resistance $R_2$ comprises a similarly arranged set of resistance elements.

In this case $R_1=R_2$ and $C_1=C_2$. $R_1$ and $R_2$ consist of two similar 4-dial conductance boxes ganged together and $C_1=.01592\ \mu f$.

The values of the resistances are given below.

*Resistance ohms and switch position*

| Dial | 0 | 1 | 2 | 3 | 4 | 5 | 6 | 7 | 8 | 9 | 10 |
|---|---|---|---|---|---|---|---|---|---|---|---|
| x 1000 | -------- | 10,000 | 5,000 | 3,333 | 2,500 | 2,000 | 1,667 | 1,429 | 1,250 | 1,111 | 1,000 |
| x 100 | Same values multiplied by 10 | | | | | | | | | | |
| x 10 | Same values multiplied by 100 | | | | | | | | | | |
| x 1 | Same values multiplied by 1000 | | | | | | | | | | |

The impedance of the network shown in Figure 7 measured across the terminals of the condenser Co will have a phase angle which can be denoted by $\phi$ and the impedance of the networks of Figures 8 and 9 measured across the condenser Co will have a phase angle which can be denoted by $\phi_2$. It can be shown that for all frequencies for which WCo is less than 1, if $Lo=CoRo_2$ then $\phi_2$ is less than $\phi$ and therefore a reduction of phase angle is obtained by the insertion of the inductance Lo.

The same procedure can be applied to the anode circuit of valve 6.

It will be found that for frequencies above that given by $W^2Co=1$, the phase-shift will increase much more rapidly than if the inductance was not present.

*Trimmer component for taking up variation in decade law*

Oscillators as described will follow a decade law of frequency over a band of frequencies for which the total phase-shift through the amplifier is negligible but depending upon the tolerances allowable there must necessarily be a lower and upper frequency limit beyond which phase-shift is not negligible and the decade law does not hold.

A trimmer component may be used to correct for departures from the decade law, and the range of frequencies for which the actual frequency agrees with the nominal can be extended.

This trimmer can be (1) When frequency is varied by changing $R_1$ and $R_2$, $C_1$ and $C_2$ remaining fixed.

(a) A variable condenser $C_1'$ in parallel with $C_1$
(b) A variable condenser $C_2'$ in parallel with $C_2$
(c) A combination of both.

(2) When frequency is varied by changing $C_1$ and $C_2$, $R_1$ and $R_2$ remaining fixed.

(a) A variable resistance in series or parallel with $R_1$
(b) A variable resistance in series or parallel with $R_2$
(c) A combination of both.

With the values as shown the nominal frequency can be varied from 0 to 11,110 C. P. S. in steps of 1 C. P. S.

While dial-type switching means may generally be used in accordance with the invention push-button or other type of switching means may be employed more advantageously in some cases.

I claim:

1. A thermionic valve oscillator comprising a thermionic amplifier section having a substantially zero phase shift and connected across its output circuit a network consisting of two parts connected in series, one of the said parts including a resistance in series with a condenser, and the other of said parts including a second resistance in parallel with a second condenser and a third resistance connected in series with the second condenser and second resistance, and connections between that part of the network containing the second and third resistances and the second condenser, and the input circuit of the amplifier section adapted to feed back thereto the voltage developed across the said part of the network in such phase that oscillations may be generated, the first resistance consisting of a plurality of resistance units all connected in parallel with each other, and means for controlling the first resistance value by means associated with each resistance unit, and the second resistance comprising a plurality of resistance units connected in parallel, and means for controlling the second resistance value by means associated with each second resistance unit.

2. A thermionic valve oscillator as claimed in claim 1 comprising a trimming condenser connected across the first condenser.

3. A thermionic valve oscillator as claimed in claim 1, comprising a trimming condenser connected across the second condenser.

4. A thermionic valve oscillator as claimed in claim 1, comprising a trimming condenser having two sections ganged together with one of said sections connected across the first condenser, and the other section connected across the second condenser.

5. A thermionic valve oscillator comprising a thermionic amplifier section having in the anode circuit of at least one valve thereof an inductance and connected across its output circuit a network consisting of two parts connected in series, one of said parts including a resistance in series with a condenser and the other of said parts including a second resistance in parallel with a second condenser and a third resistance connected in series with the second condenser and the second resistance and a connection between the last-mentioned part of the network and the input circuit of the amplifier section adapted to feed back thereto the voltage developed across the circuit comprising the second condenser, second resistance, and third resistance, the first resistance being made up of a plurality of resistance units all connected in parallel with each other, the resistance value of each unit being controllable by means associated with the resistance unit and the second resistance being made of a plurality of resistance units corresponding with the resistance units of the first resistance, the resistance units of the second being all connected in parallel with each other, the resistance value of each resistance unit of the second resistance being controllable by means associated with the said resistance units.

6. A selective thermionic valve amplifier comprising a thermionic amplifier section having substantially zero phase shift and connected across its output circuit a network consisting of a first and second part connected in series, the first of said parts including a first resistance in series with a first condenser, and the second of said parts including a second resistance in parallel with a second condenser, and a third resistance connected in series with the second condenser and second resistance, and a connection between the second part and the input circuit of the amplifying section adapted to feed back the voltage developed across that part of the network containing the second resistance and third resistance and the second condenser in such phase that oscillations may be selectively amplified, the first resistance comprising a plurality of resistance units connected in parallel and means for controlling the first resistance value by means associated with each resistance unit and the second resistance comprising a plurality of resistance units connected in parallel and means for controlling the second resistance value by means associated with each second resistance unit.

EDMUND RAMSAY WIGAN.

REFERENCES CITED

The following references are of record in the file of this patent:

UNITED STATES PATENTS

| Number | Name | Date |
| --- | --- | --- |
| 2,173,427 | Scott | Sept. 19, 1939 |
| 2,268,872 | Hewlett | Jan. 6, 1942 |

FOREIGN PATENTS

| Number | Country | Date |
| --- | --- | --- |
| 148,523 | Great Britain | July 10, 1920 |
| 497,148 | Great Britain | Dec. 12, 1938 |